United States Patent [19]

Iwahashi

[11] Patent Number: 4,677,591
[45] Date of Patent: Jun. 30, 1987

[54] SEMICONDUCTOR MEMORY DEVICE

[75] Inventor: Hiroshi Iwahashi, Yokohama, Japan

[73] Assignee: Kabushiki Kaisha Toshiba, Kawasaki, Japan

[21] Appl. No.: 754,262

[22] Filed: Jul. 12, 1985

[30] Foreign Application Priority Data

Jul. 19, 1984 [JP] Japan ................................ 59-150193

[51] Int. Cl.$^4$ .............................................. G11C 7/00
[52] U.S. Cl. ..................................... 365/189; 365/230
[58] Field of Search ................. 365/189, 230, 233, 203

[56] References Cited

U.S. PATENT DOCUMENTS 4,520,465  5/1985  Sood ................................ 365/230 X

OTHER PUBLICATIONS

Pinkham et al., "Video RAM Excels at Fast Graphics", Electronic Design, pp. 161–171, Aug. 18, 1983.

Primary Examiner—Joseph A. Popek
Attorney, Agent, or Firm—Finnegan, Henderson, Farabow, Garrett & Dunner

[57] ABSTRACT

Memory cells are allotted for successive addresses. A row decoder enables not only a row line connected to a memory cell of an address designated by an address signal, but also a row line connected to a memory cell of an address preceding or succeeding the address of the former-recited selected memory cell.

6 Claims, 4 Drawing Figures

FIG. 3

| INPUT ADDRESS SIGNAL | | | | | SELECTED CELL | SELECTED ROW LINE |
|---|---|---|---|---|---|---|
| A0 | A1 | A2 | A3 | A4 | | |
| 0 | 0 | 0 | 0 | 0 | $118_1$ | $112_1$ |
| 1 | 0 | 0 | 0 | 0 | $118_2$ | $112_1, 112_2$ |
| 0 | 1 | 0 | 0 | 0 | $118_3$ | $112_1, 112_2$ |
| 1 | 1 | 0 | 0 | 0 | $118_4$ | $112_2, 112_3$ |
| 0 | 0 | 1 | 0 | 0 | $118_5$ | $112_2, 112_3$ |
| 1 | 0 | 1 | 0 | 0 | $118_6$ | $112_3, 112_4$ |
| 0 | 1 | 1 | 0 | 0 | $118_7$ | $112_3, 112_4$ |
| 1 | 1 | 1 | 0 | 0 | $118_8$ | $112_4, 112_5$ |
| 0 | 0 | 0 | 1 | 0 | $118_9$ | $112_4, 112_5$ |
| 1 | 0 | 0 | 1 | 0 | $118_{10}$ | $112_5, 112_6$ |
| 0 | 1 | 0 | 1 | 0 | $118_{11}$ | $112_5, 112_6$ |

SEMICONDUCTOR MEMORY DEVICE

BACKGROUND OF THE INVENTION

This invention relates to a semiconductor memory device in which memory cells are allocated with successive addresses.

A conventional semiconductor memory device has a structure such as shown in, for example, FIG. 1. In the memory device shown in FIG. 1, row decoder 11 selects one of a plurality of row lines 12 according to a row address signal. Column decoder 13 selects one of a plurality of selecting lines 14 for selecting one of a plurality of column lines 16 according to a column address signal. When one selecting line 14 is selected, transistor 15, whose gate is connected to the selected selecting line 14, is turned on and column line 16, to which the selected transistor 15 is provided, is selected. When one row line 12 and one column line 16 are selected, memory cell 18, which is located at the cross point of the selected row line 12 and column line 16, is selected. Data is then read out of the selected memory cell 18.

In the conventional semiconductor memory device, row lines 12 are made of polysilicon. This gives large resistances to row lines 12. Furthermore, a plurality of memory cells 18 are connected to row lines 12, giving large capacitances to row lines 12 and thereby, in combination with the resistance factor, providing row lines 12 with heavy loads. Consequently, the time period required from when a row address signal is changed to when data is read out of the selected memory cell 18 to a selected column line 16, is significantly longer than the time period required from when a column address signal is changed to when the column line 16 is selected, so much so, in fact, that the time taken by a sense amplifier for sensing data is unsatisfactorily long. This is particularly so in a semiconductor memory device in which data is successively read out of memory cells which are allocated with successive addresses.

SUMMARY OF THE INVENTION

This invention has been carried out in light of the above mentioned circumstances and has, as its object, the provision of a semiconductor memory device in which the time required for data sensing is shortened.

According to the invention, there is provided a semiconductor memory device comprising a plurality of row lines; a plurality of column lines; an array of a plurality of memory cells provided at cross points of said row and column lines, said memory cells being allocated with successive addresses, and said memory cells, whose addresses are continuous being connected to said column lines differently from one another; row decoder means for receiving a signal of row address, for selecting a row line designated by said row address and connected to a memory cell allocated for an address designated by said row address and a column address, as well as for selecting at least one other row line to which a memory cell allocated for an address continuous to said designated address is connected; column decoder means for receiving a signal of column address, for selecting a column line designated by said column address and connected to said memory cell allocated for said designated address; and sense means connected to said column lines for detecting data stored in said selected memory cell allocated for said designated address.

BRIEF DESCRIPTION OF THE DRAWINGS

FIG. 3 is a truth table, applied to the memory device of FIG. 2, which shows the relationship between input address signals, selected memory cells and selected row lines.

DETAILED DESCRIPTION OF THE PREFERRED EMBODIMENTS

Figure 1:
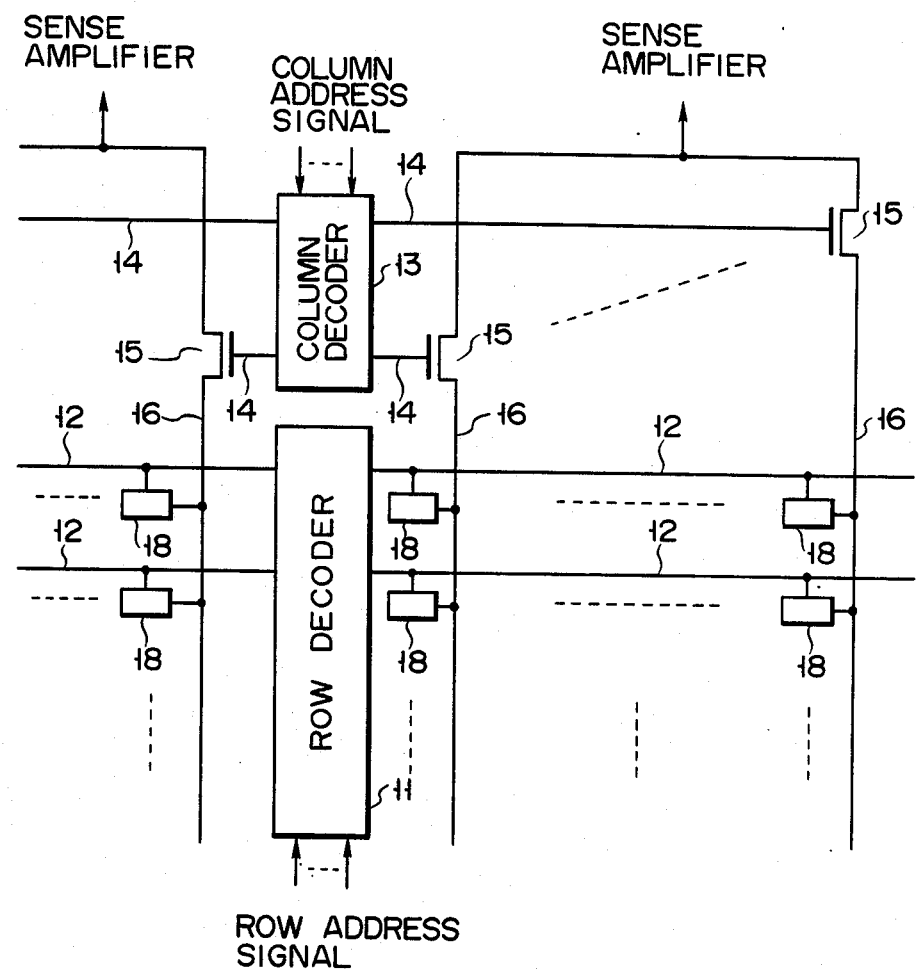
FIG. 1 shows a conventional semiconductor memory device.
Figure 2:
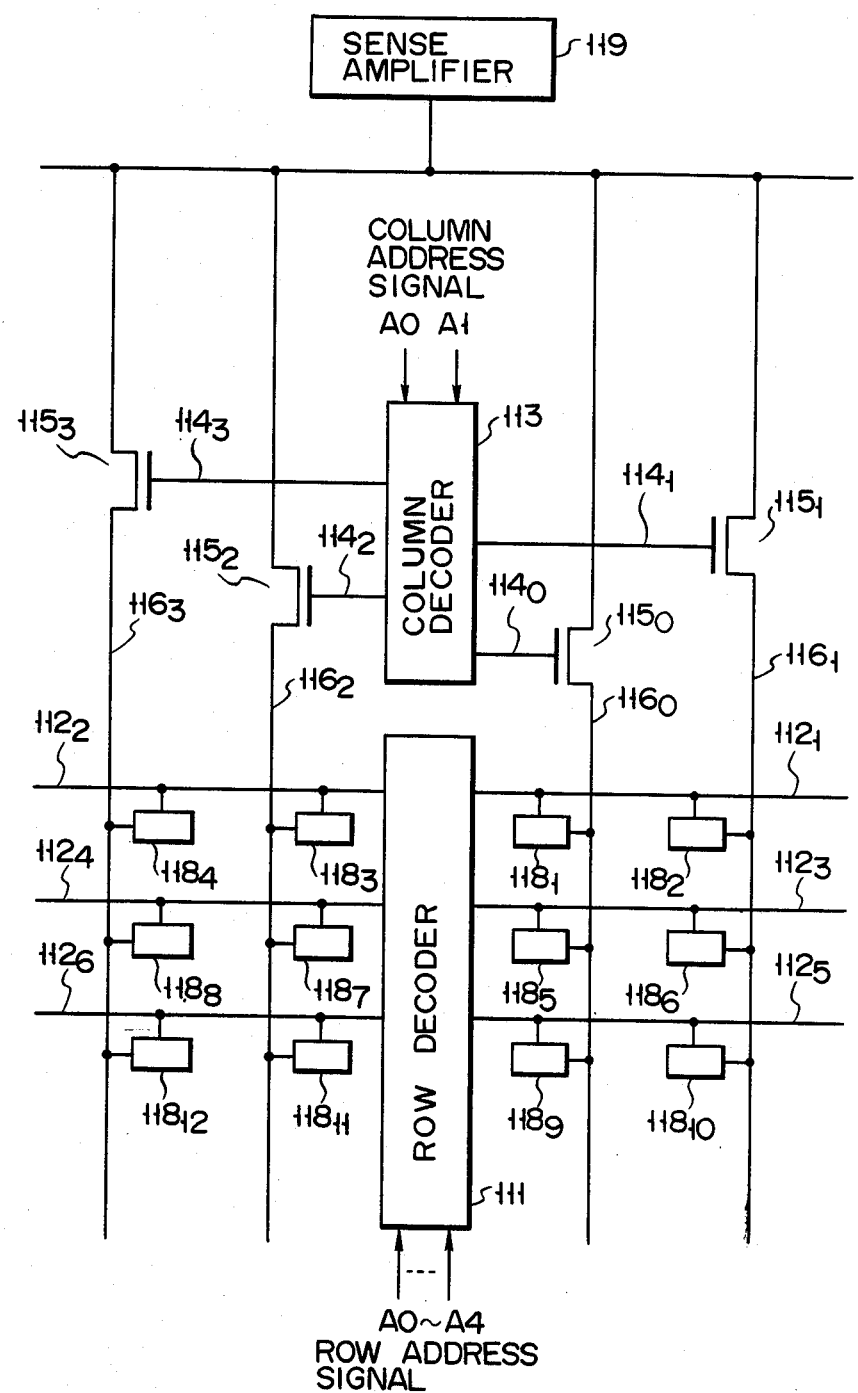
FIG. 2 shows a semiconductor memory device of an embodiment according to the invention.

In the semiconductor memory device shown in FIG. 2, row decoder 111 receives and decodes a row address signal A0–A4. Row lines $112_1$, $112_2$, $112_3$, $112_4$, $112_5$ and $112_6$ are connected to row decoder 111. Only six row lines are shown for simplicity of illustration, more row lines may actually be provided. Row lines $112_1$, $112_3$ and $112_5$ are provided at the right part of row decoder 111, when the row line pattern is seen in FIG. 2. Similarly, row lines $112_2$, $112_4$ and $112_6$ are provided at the left part of row decoder 111, when the row line pattern is seen in FIG. 2.

The counterpart of the row decoder, the column decoder 113, receives and decodes a column address signal A0 and A1.

Only four column lines, the provided column lines $116_0$, $116_1$, $116_2$ and $116_3$, are shown, for simplicity of illustration. More column lines may actually be provided. Column lines $116_0$ and $116_1$ are provided at the right part of column decoder 113, when the column line pattern is seen in FIG. 2. Column lines $116_0$ and $116_1$ cross over row lines $112_1$, $112_3$ and $112_5$. Column lines $116_2$ and $116_3$ are provided at the left part of column decoder 113, when the column line pattern is seen in FIG. 2. Column lines $116_2$ and $116_3$ cross over row lines $112_2$, $112_4$ and $112_6$. Column lines $116_0$ and $116_1$, $116_2$ and $116_3$ are connected to sense amplifier 119 through transistors $115_0$, $115_1$, $115_2$ and $115_3$, respectively. Selecting lines $114_0$, $114_1$, $114_2$ and $114_3$, for selecting column lines $116_0$, $116_1$, $116_2$ and $116_3$, are provided, said selecting lines $114_0$, $114_1$, $114_2$ and $114_3$ being connected between column decoder 113 and the gates of transistors $115_0$, $115_1$, $115_2$ and $115_3$, respectively. Memory cells $118_1$ and $118_2$ are provided at the cross points of row line $112_1$ and column lines $116_0$ and $116_1$, respectively. Memory cells $118_3$ and $118_4$ are provided at the cross points of row line $112_2$ and column lines $116_2$ and $116_3$, respectively. Memory cells $118_5$ and $118_6$ are provided at the cross points of row line $112_3$ and column lines $116_0$ and $116_1$, respectively. Memory cells $118_7$ and $118_8$ are provided at the cross points of row line $112_4$ and column lines $116_2$ and $116_3$, respectively. Memory cells $118_9$ and $118_{10}$ are provided at the cross points of row line $112_5$ and column lines $116_0$ and $116_1$, respectively. Memory cells $118_{11}$ and $118_{12}$ are provided at the cross points of row line $112_6$ and column lines $116_2$ and $116_3$, respectively. Only twelve memory cells are shown for simplicity of illustration, more memory cells may actually be provided. Memory cells $118_1$, $118_2$, $118_3$, ..., $118_{12}$ are allocated for successive addresses 1, 2, 3, ..., 12. The suffixes 1, 2, 3, ..., 12, attached to memory cells 118, denote the successive addresses allocated to memory cells 118. Memory cells whose addresses are continuous are connected to column lines differently from one another.

When row decoder 111 receives input address signal A0-A4, which is also a row address signal, row decoder 111 selects not only a row line designated by the row address signal A0-A4, to which a memory cell to be selected by the input address signal is connected, but also row lines to which are connected memory cells allocated with addresses both preceding and succeeding the address allocated to the selected memory cell.

The preceding and succeeding addresses are younger and elder, by one, than the address allocated to the selected memory cell.

Assume now that row decoder 111 receives input address signal A0-A4, which is also a row address signal, for designating the memory cell $118_6$ allocated for address 6 and inputted when the row address signal A0-A4 designates row line $112_3$, and the column address signal A0, A1 designates column line $116_1$, to both of which memory cell $118_6$ is connected. Then, in addition to selecting now line $112_3$, to which memory cell $118_6$, with address 6, is connected row decoder 111 also selects row lines $112_3$ and $112_4$ to which memory cells $118_5$ and $118_7$, with addresses 5 and 7, respectively, are connected, preceding and succeeding address 6, allotted to the selected memory cell $118_6$. Memory cells $118_5$ and $118_6$ are both connected to row line $112_3$ and, thus, row line $112_3$ is commonly selected for memory cells $118_5$ and $118_6$. When row line $112_3$ is selected, data are read out of memory cells $118_5$ and $118_6$, both connected to row line $112_3$, and appear on column lines $116_0$ and $116_1$. As well, data are read out of memory cells $118_7$ and $118_8$, both connected to row line $112_4$, and appear on column lines $116_2$ and $116_3$. Column decoder 113 selects selecting line $114_1$ to turn transistor $115_1$ on, thereby also selecting column line $116_1$. Therefore, memory cell $118_6$, which is connected to the selected row line $112_3$ and selected column line $116_1$, is selected, and data stored in the selected memory cell $118_6$ is sensed by sense amplifier 119.

Now, assume that input address signal A0-A4 increases to designate address 7, which is elder, by one, than address 6, designated at the preceding address cycle. In this case, row decoder 111 selects row line $112_4$, to which memory cell $118_7$, with address 7, is connected, as well as row lines $112_3$ and $112_4$ to which memory cells $118_6$ and $118_8$, with addresses 6 and 8, respectively, are connected, preceding and succeeding address 7, allotted to the selected memory cell $118_7$. Row lines $112_3$ and $112_4$ have been selected in the preceding address cycle and, thus, row lines $112_3$ and $112_4$ are continuously selected from the preceding address cycle. Therefore, data read out of memory cells $118_5$ and $118_6$, both connected to row line $112_3$, continue to appear on column lines $116_0$ and $116_1$ from the preceding address cycle. Similarly, data read out of memory cell $118_7$ and $118_8$, both connected to row line $112_4$, also continue to appear on column lines $116_2$ and $116_3$ from the preceding address cycle. Column decoder 113 selects selecting line $114_2$ to turn transistor $115_2$ on, thereby also selecting column line $116_2$. Therefore, memory cell $118_7$, which is connected to the selected row line $112_3$ and selected column line $116_2$, is selected, and data stored in the selected memory cell $118_7$ is sensed by sense amplifier 119.

As can be understood from the above, with the memory device, row lines $112_3$ and $112_4$, selected at the preceding address cycle, are continuously selected from the preceding address cycle to the succeeding address cycle. Consequently, data to be read out at the succeeding address cycle is read out in advance the preceding address cycle, and appears constantly on column line $116_2$ in the succeeding address cycle. Therefore, data appearing on column line $116_2$ is read out at the succeeding address cycle when only column line $116_2$ is selected. As a result, a time delay on data reading, which occurs due to a heavy load imposed on row lines $112_1$–$112_6$, is significantly shortened and, thus a high speed sensing of data can be provided.

Substantially the same thing can be applied to a case in which input address signal A0-A4 decreases to designate an address younger, by one, than the address designated in the preceding address cycle.

Row decoder 111 is programmed to carry the logic operation shown in the truth table of FIG. 3. As shown in the truth table, row decoder 111 selects row line $112_1$ when the input address signal (row address signal) A0=0, A1=0, A2=0, A3=0 and A4=0, for designating memory cell $118_1$, is inputted. Row decoder 111 selects row lines $112_1$ and $112_2$ when input address signal A0=1, A1=0, A2=0, A3=0 and A4=0, for designating memory cell $118_2$, is inputted. Row decoder 111 selects row lines $112_1$ and $112_2$ when input address signal A0=0, A1=1, A2=0, A3=0 and A4=0, for designating memory cell $118_3$, is inputted. Row decoder 111 selects row lines for another input address signal A0-A4 as shown in the truth table shown in FIG. 2.

A logic equation I1 for selecting row line $112_1$ is given from the truth table shown in FIG. 2 by $$I1 = \overline{A2} \cdot \overline{A3} \cdot \overline{A4} \cdot (\overline{A0} + \overline{A1})$$

A logic equation I2 for selecting row line $112_2$ is given from the truth table shown in FIG. 2 by $$I2 = \overline{A2} \cdot \overline{A3} \cdot \overline{A4} \cdot (A0 + A1) + \overline{A0} \cdot \overline{A1} \cdot A2 \cdot \overline{A3} \cdot \overline{A4}$$

Figure 4:
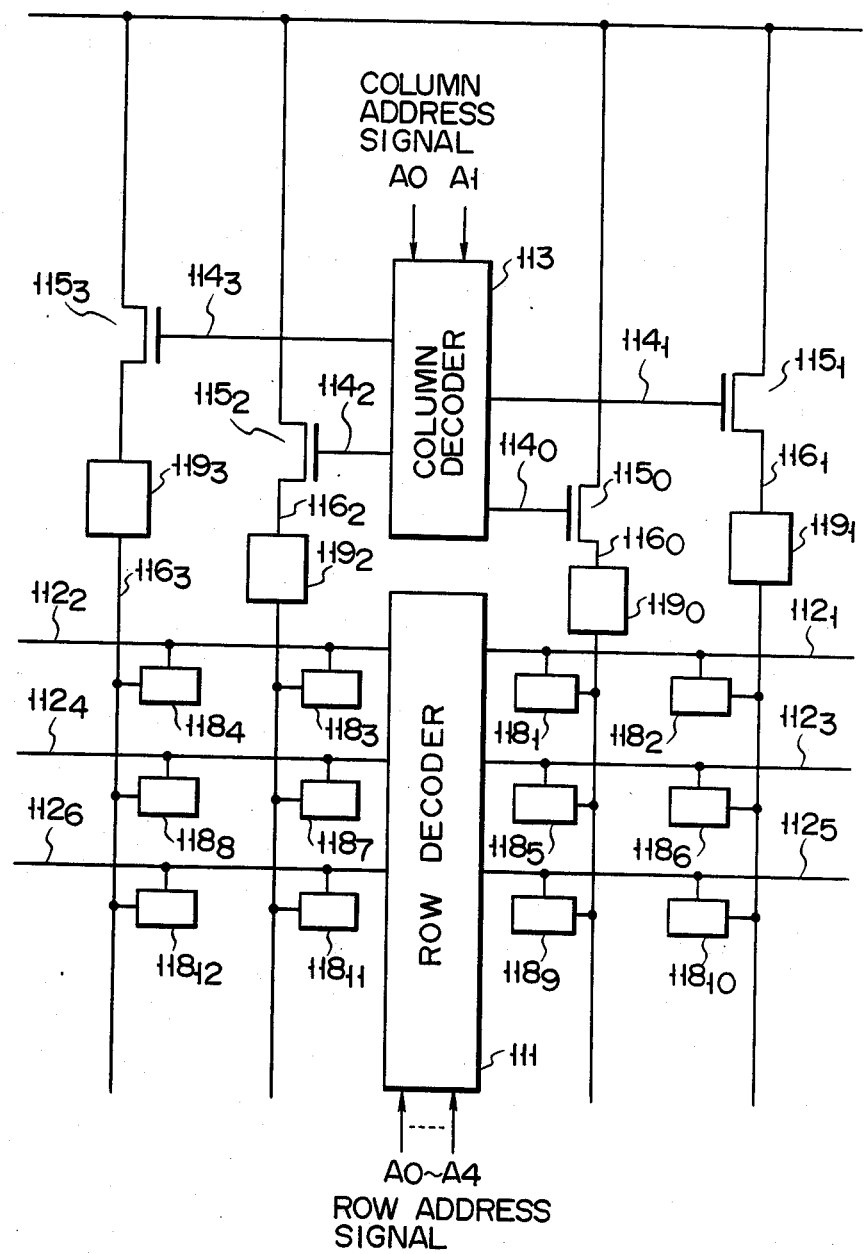
FIG. 4 shows a semiconductor memory device of another embodiment according to the invention.

In the memory device shown in FIG. 4, sense amplifiers $119_0$, $119_1$, $119_2$ and $119_3$ are provided to respective column lines $116_0$, $116_1$, $116_2$ and $116_3$. Sense amplifier $119_0$ is inserted into column line $116_0$ between transistor $115_0$ and the cross points of row lines $112_1$, $112_3$ and $112_5$. Sense amplifier $119_1$ is inserted into column line $116_1$ between transistor $115_1$ and the cross points of row lines $112_1$, $112_3$ and $112_5$. Sense amplifier $119_2$ is inserted into column line $116_2$ between transistor $115_2$ and the cross points of row lines $112_2$, $112_4$ and $112_6$. Sense amplifier $119_3$ is inserted into column line $116_3$ between transistor $115_3$ and the cross points of row lines $112_2$, $112_4$ and $112_6$. With this embodiment, sensing speed is increased, since the length between memory cells $118_1$–$118_{12}$ and sense amplifiers $119_0$–$119_3$ is shortened.

This invention is not limited to the above mentioned embodiments. Other embodiments may be considered. For example, it is not necessarily required to select row lines to which are connected the memory cells with addresses preceding and succeeding, respectively, addresses allocated to a selected memory cell. Only one memory cell allocated with the preceding or succeeding address need be selected. A memory cell allocated with the preceding address is selected when input address signal A0-A4 increases, while, a memory cell allocated with the succeeding address is selected when input address signal A0-A4 decreases. Furthermore, this invention can be applied to a memory device with a variety of bits, though the embodiments disclose only 5 bit memory devices.

What is claimed is:

1. A semiconductor memory device comprising:
   a plurality of row lines;
   a plurality of column lines;
   an array of a plurality of memory cells which are provided at cross points of said row and column lines, said memory cells being allocated with successive addresses, and said memory cells, whose addresses are continuous, being connected to said column lines differently from one another;
   row decoder means for receiving a signal of row address, for selecting a row line designated by said row address and connected to a memory cell allocated for an address designated by said row address and a column address, as well as for selecting at least one other row line to which a memory cell allocated for an address continuous to said designated address is connected;
   column decoder means for receiving a signal of column address, for selecting a column line designated by said column address and connected to said memory cell allocated for said designated address; and
   sense means connected to said column lines for detecting data stored in said selected memory cell allocated for said designated address.

2. A semiconductor memory device according to claim 1, wherein said sense means is a sense amplifier commonly connected to said column lines.

3. A semiconductor memory device according to claim 1, wherein said sense means are sense amplifiers, each connected to said column lines.

4. A semiconductor memory device according to claim 1, wherein half of said row lines are provided at the left part of said row decoder means, and the remaining half of said row lines are provided at the right part of said row decoder means.

5. A semiconductor memory device according to claim 1, wherein said address, continuous to said designated address, is an address preceding said designated address.

6. A semiconductor memory device according to claim 1, wherein said address, continuous to said designated address, is an address succeeding said designated address.

* * * * *